United States Patent
Nishiguchi et al.

(10) Patent No.: US 6,621,227 B1
(45) Date of Patent: Sep. 16, 2003

(54) DISCHARGE GENERATING APPARATUS AND DISCHARGE GENERATING METHOD

(75) Inventors: Toshiji Nishiguchi, Kawasaki (JP); Ikuo Nakajima, Ohta-ku (JP); Hiromi Aoyagi, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/705,801

(22) Filed: Nov. 6, 2000

(30) Foreign Application Priority Data

Feb. 8, 2000 (JP) ........................................ 2000-030882
May 23, 2000 (JP) ........................................ 2000-151980

(51) Int. Cl.⁷ ................................................. H01J 7/24
(52) U.S. Cl. ............................. 315/111.21; 313/231.31; 118/723 E
(58) Field of Search .................. 315/111.21, 111.71; 118/723 E, 723 R; 204/192.12, 192.2; 313/552, 231.41, 231.31

(56) References Cited

U.S. PATENT DOCUMENTS

| 5,198,724 A | * | 3/1993 | Koinuma et al. | ............ 156/345 |
|---|---|---|---|---|
| 5,369,336 A | * | 11/1994 | Koinuma et al. | ....... 315/111.21 |
| 5,549,780 A | * | 8/1996 | Koinuma et al. | ........ 118/723 E |
| 5,753,886 A | * | 5/1998 | Iwamura et al. | ............. 156/345 |

FOREIGN PATENT DOCUMENTS

| JP | 8321397 | 12/1996 |
|---|---|---|
| JP | 1000325 | 1/1998 |
| JP | 2863854 | 3/1999 |

* cited by examiner

*Primary Examiner*—Don Wong
*Assistant Examiner*—Thuy Vinh Tran
(74) *Attorney, Agent, or Firm*—Fitzpatrick, Cella, Harper & Scinto

(57) ABSTRACT

Provided are a discharge generating apparatus, a discharge generating method, and a gas decomposing method capable of generating a large amount of an atmospheric plasma and increasing processing efficiency of a plasma processing, gas decomposition, or the like, by such a configuration that at least either one of high-potential and low-potential electrodes is comprised of a plurality of electrodes, a space between the electrodes is filled with an inorganic dielectric having a structure permitting flow of a gas, and a glow discharge is generated between the electrodes to change the gas existing between the electrodes, into a plasma under ordinary pressure.

30 Claims, 14 Drawing Sheets

DISCHARGE GENERATING APPARATUS AND DISCHARGE GENERATING METHOD

BACKGROUND OF THE INVENTION

1. Field of the Invention

The present invention relates to a discharge generating apparatus and a discharge generating method and, more particularly, to a discharge generating apparatus and a discharge generating method capable of generating a plasma applicable to decomposition of an organic compound, surface treatment, etc. using the energy of a plasma, by generating a plasma from a gas in a glow discharge under ordinary pressure.

2. Related Background Art

A number of methods have been developed heretofore generally as methods of generating a discharge under ordinary pressure. The methods can be roughly classified under a silent discharge, a creeping discharge, a pulse corona discharge, and so on. Among these, the silent discharge is known as ozone generators, in which the electrode-to-electrode distance is very short, about several mm, and a lot of reactors need to be prepared in order to attain an stable discharge with a large amount of a gas. The creeping discharge is a discharge generated along a ceramic surface with application of alternating electric field between electrodes set on the surface and inside an inorganic material such as ceramics or the like, which is an extremely local discharge state. As for the pulse corona discharge, the rise time of the electrodes is quick, 10 to 50 ns, streamer corona is generated in the electrode space with application of high voltage of extremely short pulses having the half width of 50 to 500 ns, and the power supply, electrodes, etc. are expensive. There are also proposals of methods of establishing an stable glow discharge under the atmospheric pressure with some measures on the electrodes, but they still have disadvantages including the need for an expensive gas such as helium or argon, extreme narrowness of a stable discharge part, and so on.

Therefore, there exist discharge generating methods making use of inorganic dielectrics, as methods of stably generating a discharge under ordinary pressure while overcoming these disadvantages. These are methods of generating the plasma by applying ac voltage or pulse voltage between electrodes with the inorganic dielectric in between. More specifically, the voltage from a high voltage ac power supply (ac voltage supply) or a pulse power supply (pulse voltage supply) is placed between opposed electrodes to establish a potential difference between the electrodes, whereupon polarization occurs inside the inorganic dielectric filling the space between the electrodes to generate a pulsed microdischarge of the ns order. This microdischarge changes the gas into a plasma.

According to the above discharge generating methods making use of the inorganic dielectrics, however, since the voltage necessary for generation of a glow discharge is dependent upon the distance between the electrodes, the voltage necessary for generation of arbitrary electric current increases with increase in the distance between the electrodes. For that reason, there is a problem that scale increase of the discharge generating apparatus using these methods is restricted by setting of the distance between the electrodes in the prior art. This problem was hindrance to scale increase in terms of design of apparatus. Describing this point in further detail, in the plasma formation by these methods, for example, in a process wherein a gas under flow is continuously and efficiently converted into a plasma, since increase of flow rates can induce influence of pressure loss due to the dielectric filling, the flow passage needs to be set large, and thus the distance between the electrodes has to be increased. Consequently, it also requires increase of input voltage in order to maintain decomposition efficiency and this increase of voltage poses the problems of increase in the size of power supply, or restrictions on the discharge conditions. The increase in the distance between the electrodes made it unfeasible to convert a large amount of a gas into a plasma at high efficiency by the prior art methods, because of limitations to the safety, construction of apparatus, and so on.

SUMMARY OF THE INVENTION

The present invention solved the above problems and an object of the invention is to provide a discharge generating apparatus and a discharge generating method that can generate a large amount of a plasma, that can generate the plasma under ordinary pressure, and that can increase the processing efficiency of the plasma processing, gas decomposition, and so on.

Specifically, an object of the present invention is to provide a discharge generating apparatus comprising high-potential and low-potential electrodes, at least either one of the high-potential electrode and the low-potential electrode comprising a plurality of electrodes, and having such a cinfiguration that a space between the electrodes is filled with an inorganic dielectric having a structure permitting flow of a gas, wherein a discharge is generated between the electrodes to change the gas existing between the electrodes, into a plasma.

Another object of the invention is to provide a discharge generating method comprising the steps of placing high-potential and low-potential electrodes, at least either one of the high-potential electrode and the low-potential electrode comprising a plurality of electrodes, and filling a space between the electrodes with an inorganic dielectric having a structure permitting flow of a gas, wherein a discharge is generated between the electrodes to change the gas existing between the electrodes, into a plasma.

In the above discharge generating apparatus or discharge generating method, it is preferable that the gas existing between the electrodes be changed into a plasma under ordinary pressure or that the discharge be a glow discharge.

It is also preferable that the high-potential and low-potential electrodes are arranged in alternate fashion or that the inorganic dielectric be filled between one high-potential electrode and at least one low-potential electrode.

It is also preferable that the high-potential electrode be connected to an ac voltage supply or to a pulse voltage supply or that the low-potential electrode be grounded.

It is also preferable that the high-potential electrode be connected through an electric conductor to the ac voltage supply or to the pulse voltage supply or that the low-potential electrode be grounded through another electric conductor.

It is also preferable that one of the high-potential electrode and the low-potential electrode be two or more internal electrodes and that the other be a cylindrical electrode surrounding the internal electrodes.

It is also preferable that the shape of the internal electrodes be a rodlike shape or a platelike shape.

It is also preferable that the internal electrodes be connected to the ac voltage supply or to the pulse voltage supply and that the cylindrical electrode be grounded.

It is also preferable that the inorganic dielectric be filled in the presence of a gap permitting flow of the gas between the internal electrodes and the cylindrical electrode.

It is also preferable that the discharge be utilized for decomposition of an organic compound existing in the gas.

It is also preferable that the inorganic dielectric have a structure with gaps permitting flow of the gas and generating the discharge in the gaps of the inorganic dielectric.

It is also preferable that the inorganic dielectric be a ferroelectric material and it is particularly preferable that the inorganic dielectric be comprised of at least one selected from barium titanate and strontium titanate. The inorganic dielectric is preferably a granular material.

DETAILED DESCRIPTION OF THE PREFERRED EMBODIMENTS

First Embodiment

The first embodiment of the present invention will be described below. The plasma was generated heretofore by placing a potential difference between electrodes in such a state that a high potential was applied to one of opposed electrodes while the other electrode was grounded, whereas the first embodiment enables generation of a plasma in large scale under such conditions that high-potential and low-potential electrodes are arranged independent of each other, at least either one of the high-potential and low-potential electrodes consists of a plurality of electrodes, and an inorganic dielectric is filled between these electrodes. Specific configurations according to the first embodiment of the present invention will be described below, but it is noted that the present invention is by no means intended to be limited to these.

Figure 1:
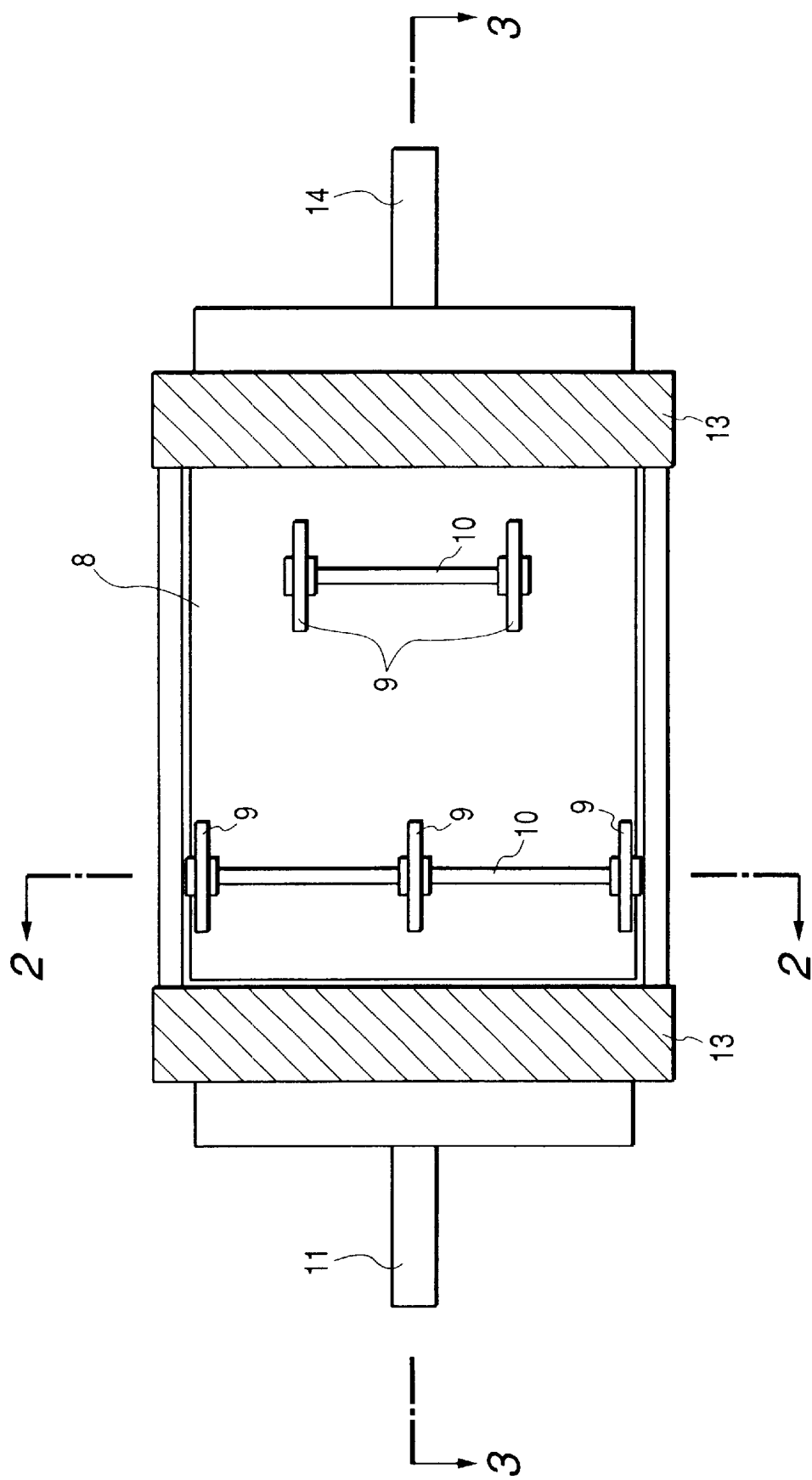
FIG. 1 is a schematic outside view of the apparatus according to the first embodiment of the present invention.
Figure 2:
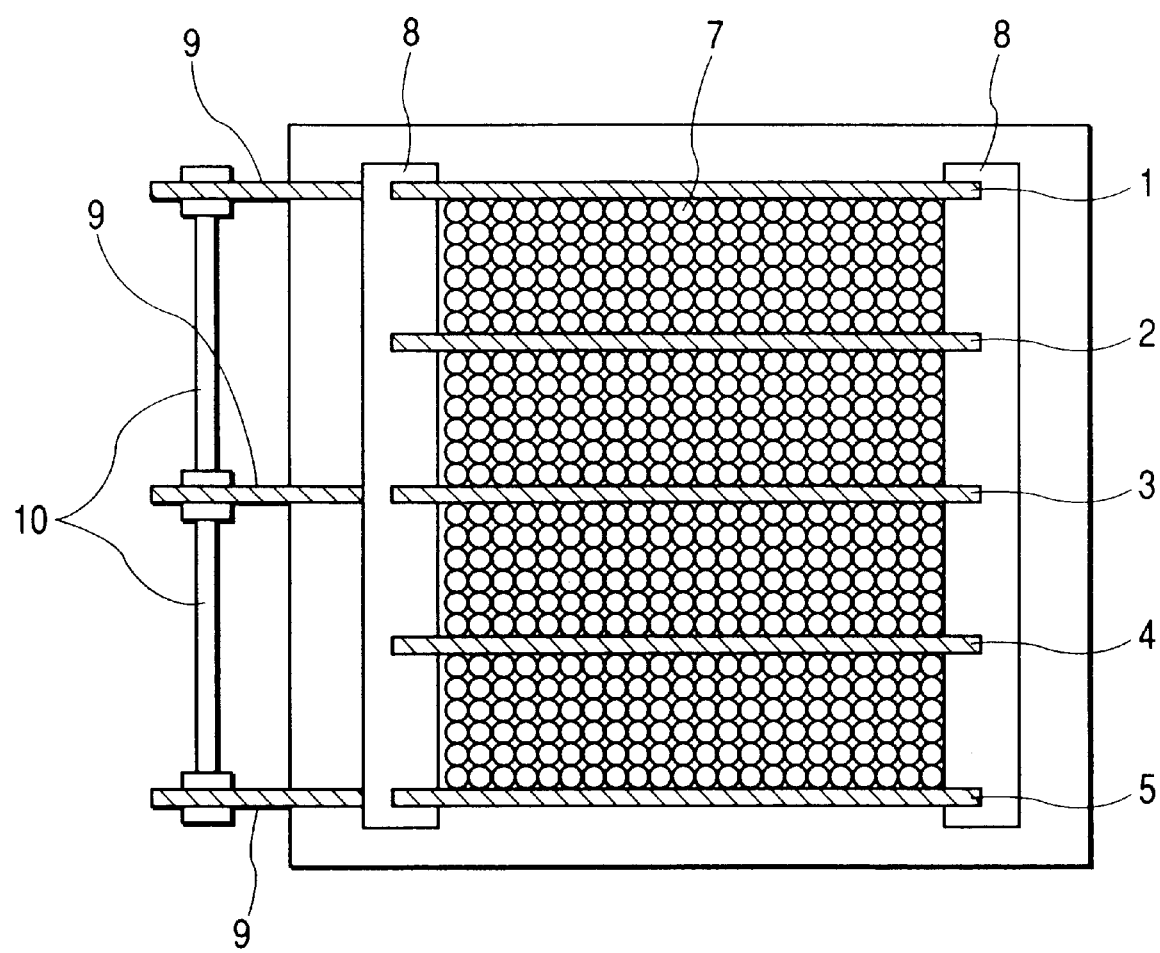
FIG. 2 is a schematic cross-sectional view of the apparatus illustrated in FIG. 1, cut by the plane normal to the direction of flow of a gas (i.e., 2—2 cross section of FIG. 1)
Figure 3:
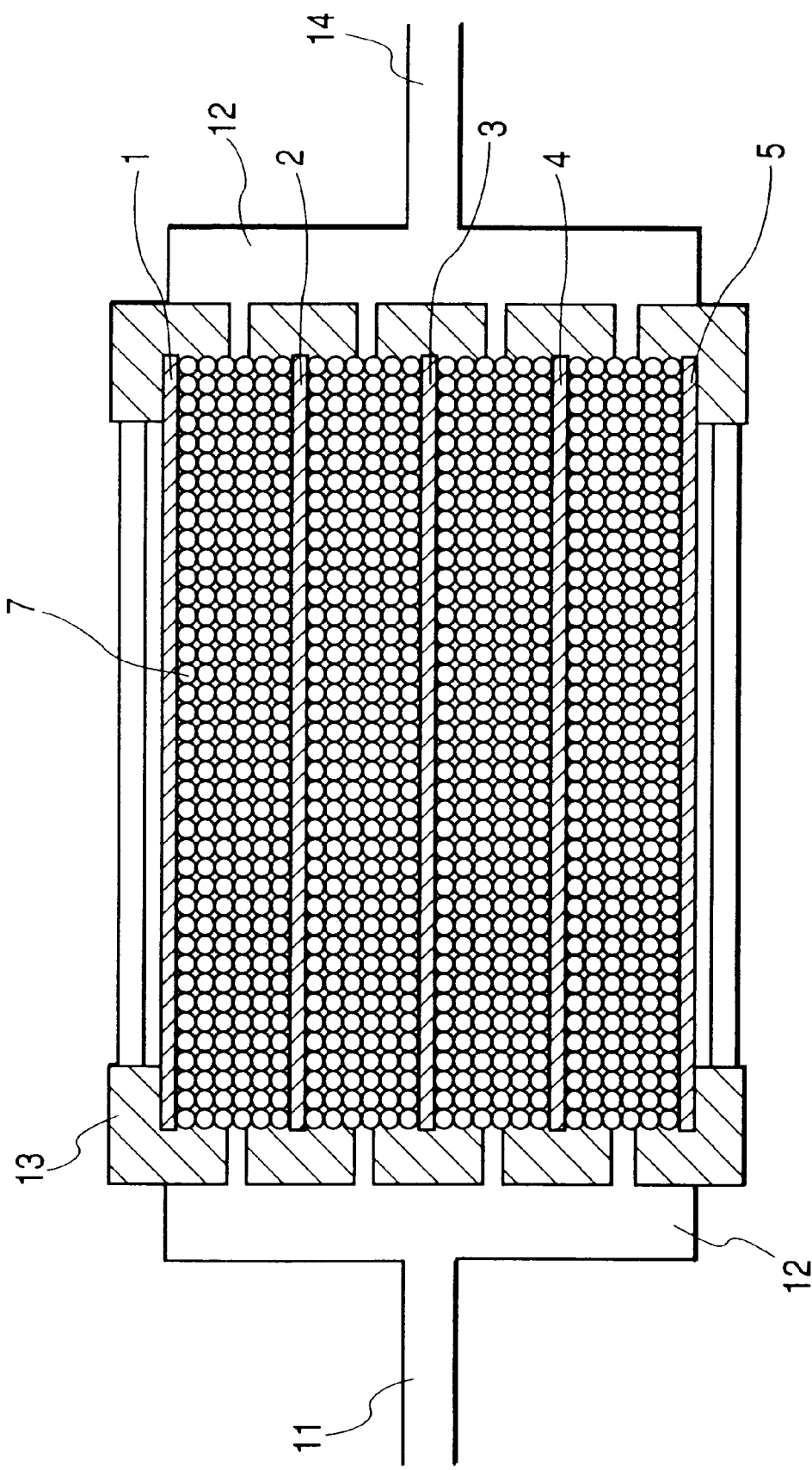
FIG. 3 is a schematic cross-sectional view of the apparatus illustrated in FIG. 1, cut by the plane along the direction of flow of a gas (i.e., 3—3 cross section of FIG. 1)
Figure 4:
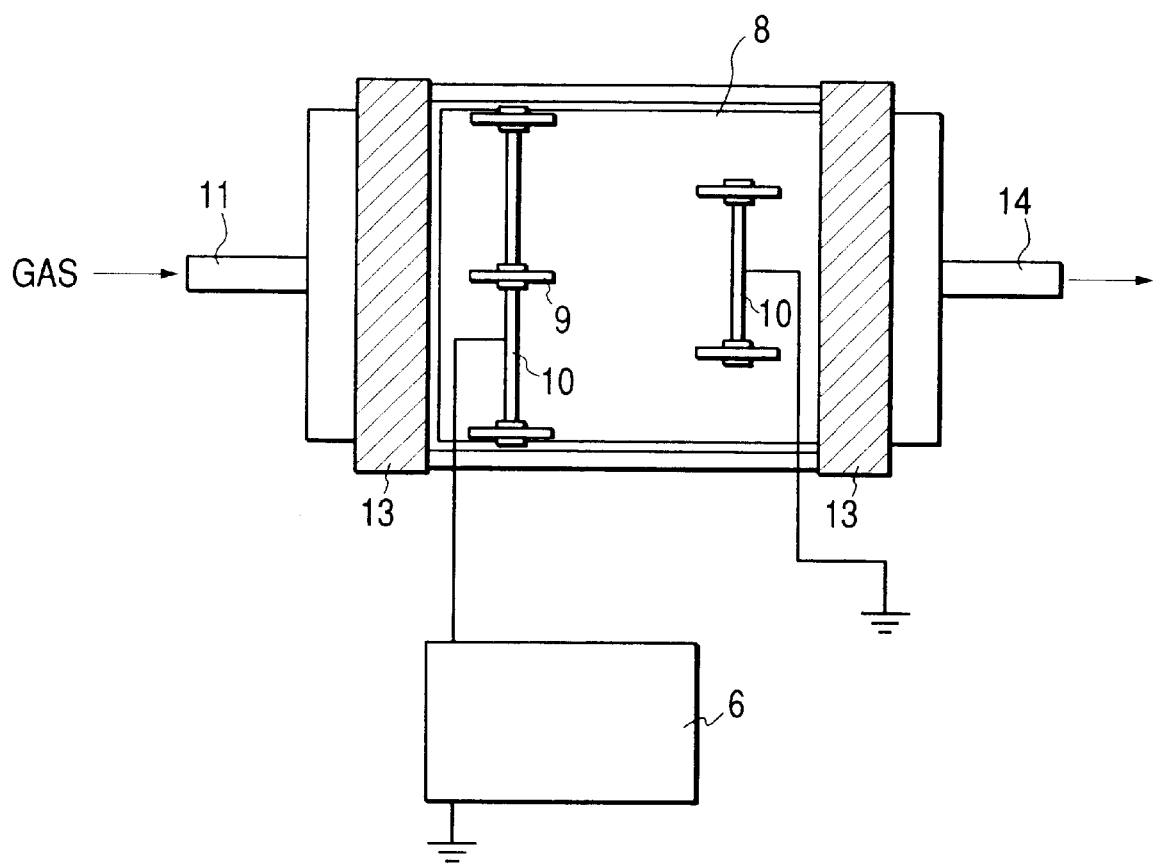
FIG. 4 is a schematic connection diagram between the apparatus in the first embodiment of the invention and the power supply.

FIG. 1 is an outside view of an example of the apparatus according to the first embodiment of the present invention. This is an example of the apparatus for changing the gas under continuous flow into a plasma. FIG. 2 is a cross-sectional view of the apparatus illustrated in FIG. 1, cut by the plane normal to the direction of flow of a gas, i.e., 2—2 cross section of FIG. 1. FIG. 3 is a cross-sectional view of the apparatus illustrated in FIG. 1, cut by the plane along the direction of flow of a gas, i.e., 3—3 cross section of FIG. 1. Further, FIG. 4 is a structural diagram showing connection of the apparatus to an ac power supply (ac voltage supply) 6. In the figures, numerals 1 to 5 denote electrodes, 6 does the ac power supply, 7 the inorganic dielectric, 8 side plates, 9 projecting portions of the electrodes, 10 connection jigs, 11 a gas inlet, 12 diffusion spaces, 13 insulator partitions, and 14 a gas outlet.

The apparatus in the first embodiment has a plurality of electrodes. In the apparatus example illustrated in FIG. 1, the apparatus has five electrodes and they are connected to the high potential side and to the low-potential side. This example. employs an electrode configuration in which the electrode 2 and electrode 4 of the low potential are placed opposite the electrode 1, electrode 3, and electrode 5 of the high potential, the electrode 1, electrode 3, and electrode 5 are connected to the ac power supply (ac voltage supply) 6, and the ac voltage can be applied from the power supply to the electrodes. The electrode 2 and electrode 4 are in the electrically grounded state. The number of these electrodes can be determined arbitrarily depending upon the scale of the apparatus. For large processing flow rates, the scale of the apparatus can be increased by increasing the number of electrodes, without lowering processing efficiency. Another applicable configuration is such that the electrodes 1, 3, 5 are grounded as low-potential electrodes while the electrodes 2, 4 are connected as high-potential electrodes to the power supply 6. When the electrode structure employed is the one in which the high-potential and low-potential electrodes are arranged in alternate fashion as described above, it becomes easier to design any desired electrode-to-electrode distance than in the case of the electrode structure wherein the electrodes are internal electrodes and a cylindrical electrode surrounding them as in the example of the second embodiment described hereinafter. Even if the flow passage of a processing gas expands with increase in the size of apparatus the desired electrode-to-electrode distance will be able to be maintained by increasing the number of electrodes as described above; therefore, it makes the increase in the size of apparatus easier while achieving a good discharge. The shape of the electrodes is preferably a platelike shape or a rodlike shape, for example, and is more preferably the plate shape. The example of the present embodiment employs the platelike electrodes, as illustrated in FIGS. 2 and 3. The electrodes 1 to 5 do not always have to reach the right side plate 8, but the electrodes 1 to 5 reaching the right side plate 8, as illustrated in FIG. 2, permit a uniform discharge to be induced throughout the entire space. The ac voltage supply 6 may be replaced by a pulse voltage supply.

The inorganic dielectric 7 is filled between the electrodes. There are no specific restrictions on the shape of this inorganic dielectric, but it is suitably one having such a structure that the gas can permeate through gaps like a granular material and that the discharge occurs in the gaps of the dielectric, as illustrated as an example in FIG. 2 or FIG. 3. The inorganic dielectric is desirably a ferroelectric material and preferably one having a predetermined dielectric constant. The inorganic dielectric can be one having a small dielectric constant, but the discharge conditions are limited in that case. Therefore, the dielectric constant is particularly desirably not less than about 1000. Preferred materials of the inorganic dielectric are barium titanate and strontium titanate, but the materials are not limited to these examples. The inorganic dielectric may be selected from commonly known dielectrics and can be selected depending upon purposes.

Each of the electrodes 1 to 5 is fixed while being held by the two side plates of an electric insulator such as Teflon (poly(tetrafluoroethylene)) or the like. For connection with the power supply or the like, part of each electrode projects through the side plate and the projecting portions 9 thereof are connected each to the power supply or the like. In the example of the apparatus illustrated in FIG. 1, the electrodes of the same kind are connected by the connection jig 10 of an electric conductor on each of the high potential side and the low potential side, and the connection jigs are connected to the power supply, whereby a potential difference is created between the electrodes. The electrodes may also be connected to respective independent power supplies without use of the connection jigs 10, but an optimum method can be selected depending upon circumstances such as the apparatus cost, the space, and so on.

For generating the plasma by the present apparatus, the gas to be changed into the plasma is first introduced under arbitrary pressure and at an arbitrary flow rate through the gas inlet 11. There are no specific restrictions on this gas. After the gas is introduced through the inlet, it goes into the diffusion space 12. The diffusion space 12 and the plasma space filled with the inorganic dielectric 7 are separated from each other by the insulator partition 13 of structure permitting permeation of a gas, such as a mesh or punching board of an insulating material, e.g., Teflon, poly(ethylene terephthalate), or the like, so as to prevent the inorganic dielectric from entering the diffusion space 12.

The gas filling the diffusion space 12 then permeates through holes of the insulator partition 13 to enter the plasma space filled with the inorganic dielectric. Here the ac voltage is applied to the high-potential electrodes to induce a glow discharge and generate the plasma. On this occasion, where the gas contains an organic compound, the organic compound is decomposed by the energy of the plasma. There are no specific restrictions on the organic compound in this case and thus the apparatus is particularly effective to decomposition of chemical substances that cannot be released in high concentrations into the atmosphere, e.g., such as volatile organic compounds, chlorine-based substances, and so on. The plasma gas inside the apparatus leaves the apparatus through the gas outlet 14 to the outside. In the case wherein the organic compound is decomposed, the products resulting from the decomposition, together with the other gas, are discharged to the outside of the apparatus.

In the case of execution of decomposition by this method, the discharge states differ depending upon voltages applied to the electrodes, the gas flow rates, the areas of the electrodes, the electrode-to-electrode distances, the dielectric characteristics, etc., and thus decomposition characteristics of the organic compound also differ. Therefore, the products can be controlled by selecting a decomposition level according to the purpose. The products resulting from the decomposition may also be subjected to an optimum secondary processing, such as collection with water scrubber or activated carbon, or the like, as occasion may demand.

Figure 15:
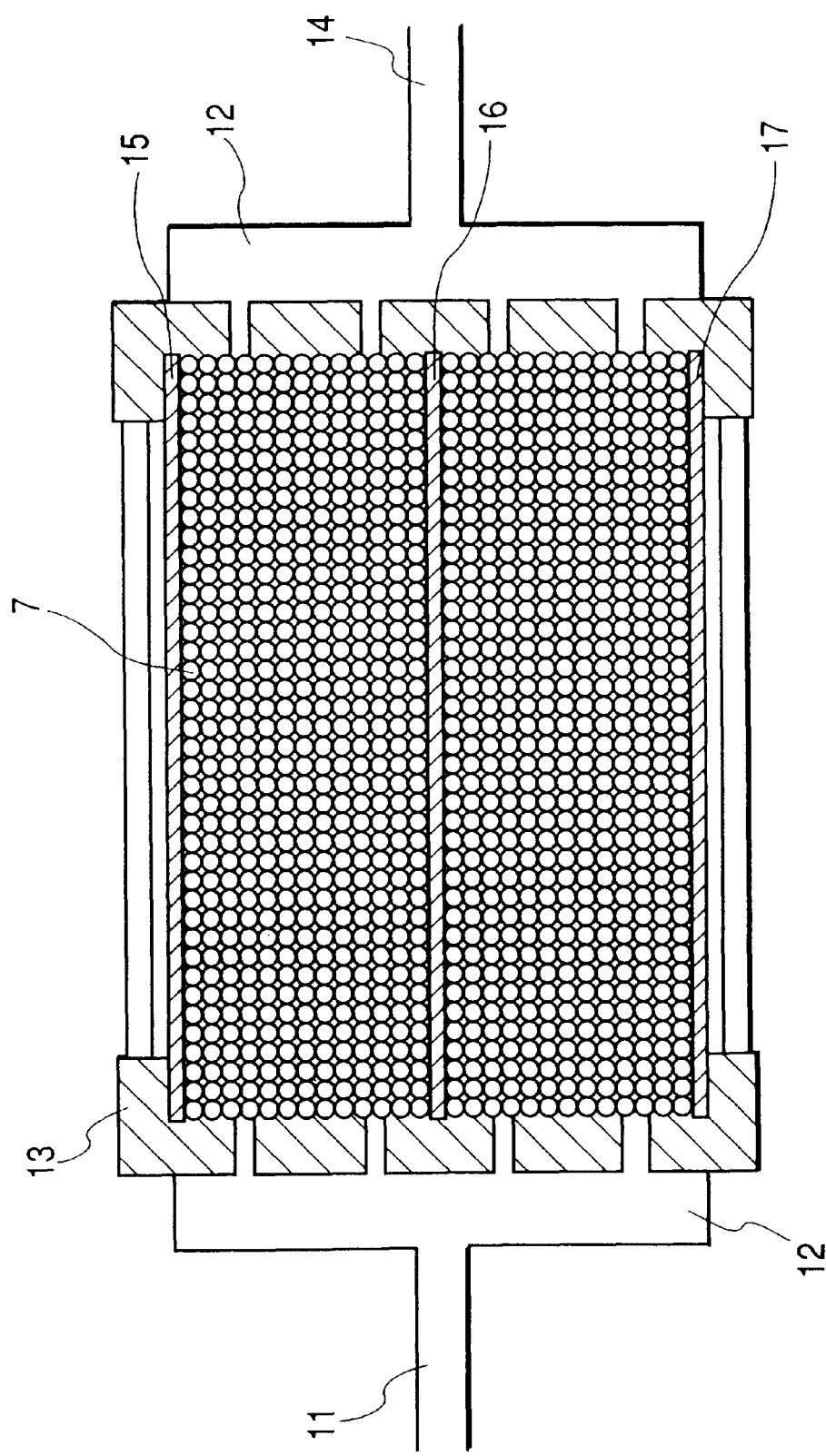
FIG. 15 is a schematic cross-sectional view showing another example of the first embodiment of the present invention.

FIG. 15 shows another example of the first embodiment of the present invention. As illustrated in this cross-sectional view obtained by cutting the apparatus by the plane along the direction of flow of the gas, the discharge generating apparatus may also be constructed using three electrodes 15 to 17. The electrodes may be set so that the electrode 16 is the high-potential electrode while the electrodes 15, 17 are the low-potential electrodes, or conversely, so that the electrode 16 is the low-potential electrode while the electrodes 15, 17 are the high-potential electrodes. As in this example, only either the high-potential electrode or the low-potential electrode may be comprised of a plurality of electrodes.

Second Embodiment

The second embodiment of the present invention will be described below. The plasma was generated before by placing a potential difference between the electrodes with applying a high potential to one of opposed electrodes and grounding the other electrode, whereas the second embodiment permits generation of the plasma in arbitrary scale and thus achieves increase of size readily, by employing such a configuration that the inorganic dielectric is filled between a plurality of internal electrodes and a cylindrical electrode surrounding them and by selecting the number of internal electrodes and the shape of the cylindrical electrode. The present embodiment can also change a large amount of a gas into a plasma under ordinary pressure.

Figure 9:
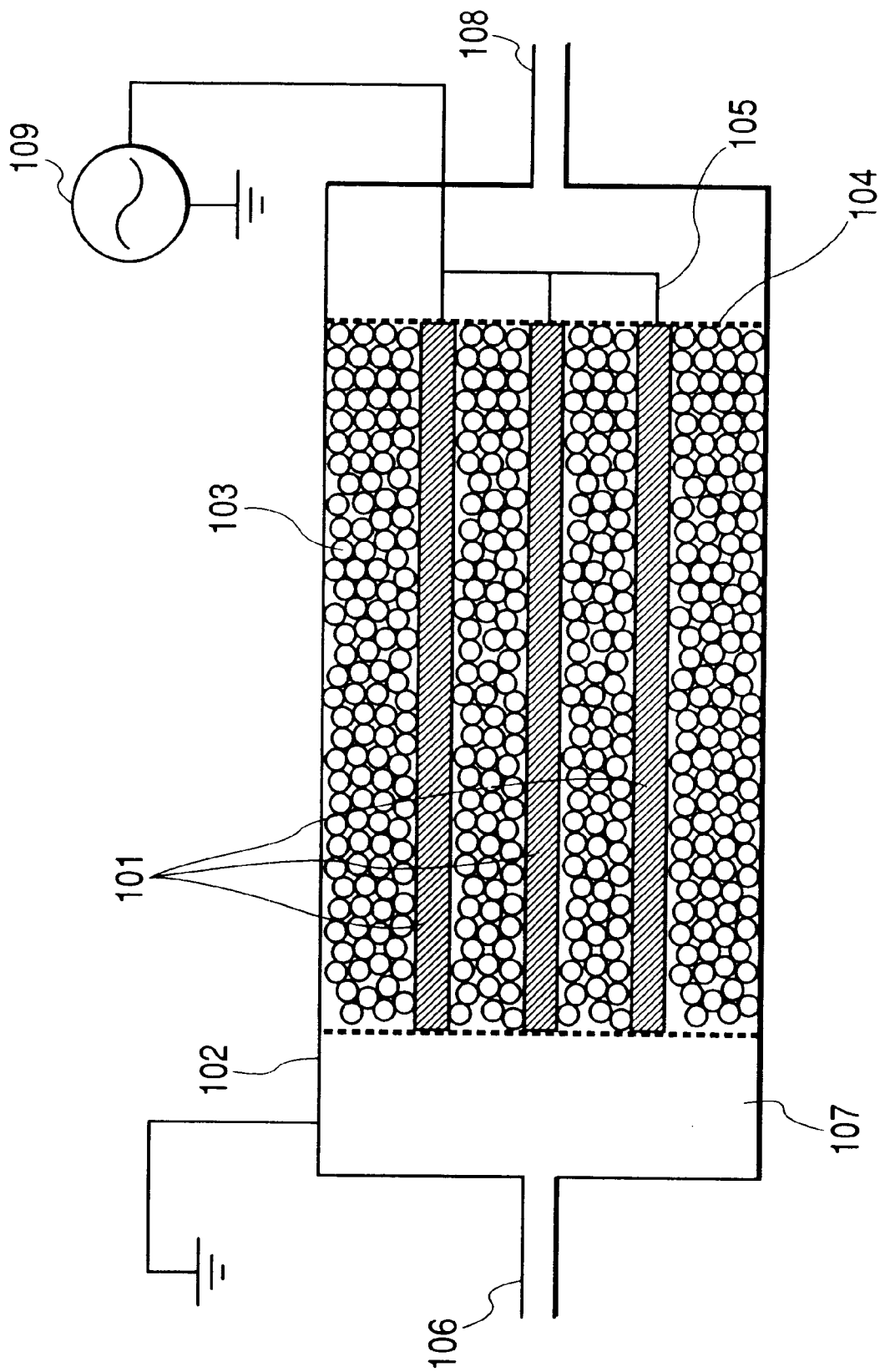
FIG. 9 is a schematic cross-sectional view of the discharge generating apparatus according to the second embodiment of the present invention, cut by the plane along the direction of flow of a gas (9—9 cross section of FIG. 11)
Figure 10:
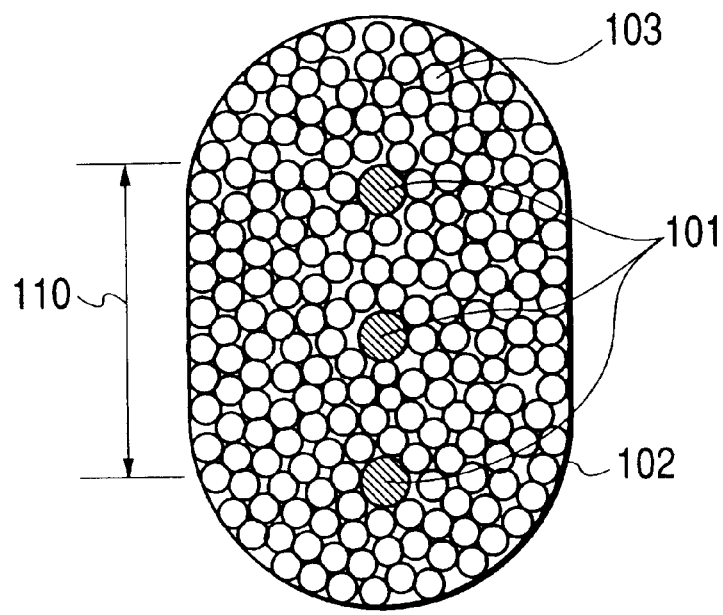
FIG. 10 is a schematic cross-sectional view of the discharge generating apparatus according to the second embodiment of the present invention, cut by the plane normal to the direction of flow of a gas (10—10 cross section of FIG. 11)
Figure 12:
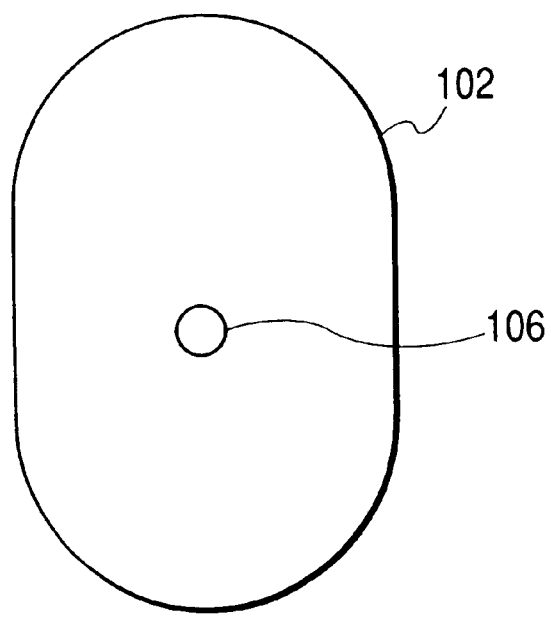
FIG. 12 is a schematic outside view of the apparatus of FIG. 11 from the side of a gas inlet 106.
Figure 11:
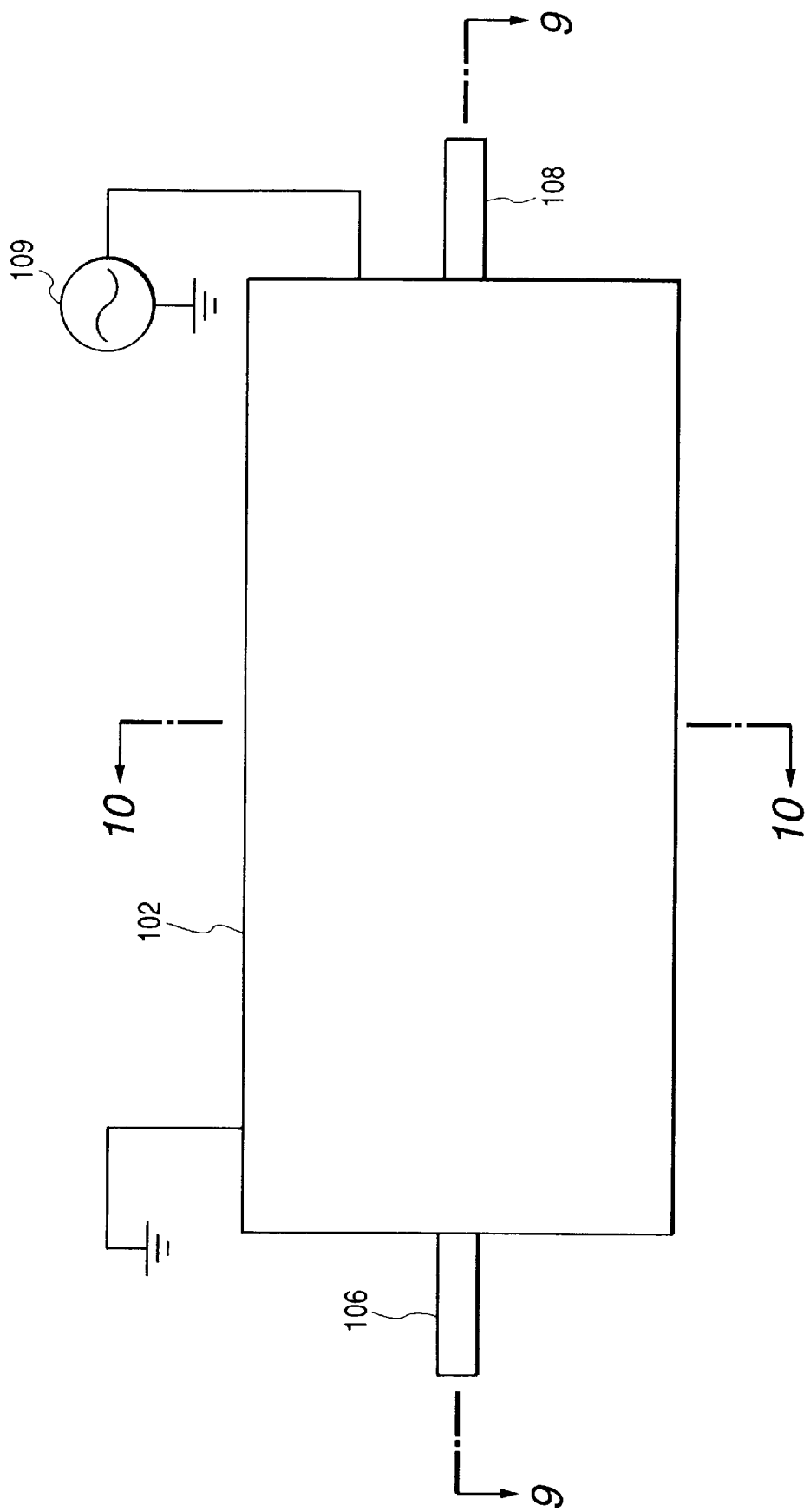
FIG. 11 is a schematic outside view of the discharge generating apparatus according to the second embodiment of the invention.

Specific configurations associated with the second embodiment of the present invention will be described with reference to the drawings, but it is noted that the present invention is by no means intended to be limited to these. FIG. 9 to FIG. 12 show an example of the discharge generating apparatus in the second embodiment. FIG. 11 is a schematic outside view of the example of the discharge generating apparatus for changing the gas under continuous flow into the plasma, FIG. 12 is an outside view of the apparatus seen from the gas inlet 106, FIG. 10 is 10—10 cross section of FIG. 11, and FIG. 9 is 9—9 cross section of FIG. 11. Numeral 101 designates the internal electrodes, 102 the cylindrical electrode, 103 the inorganic dielectric, 104 the partitions, 105 power-supply connection portions, 106 the gas inlet, 107 the diffusion space, 108 the gas outlet, 109 the ac power supply (ac voltage supply), and 110 a straight portion.

This apparatus is comprised of the internal electrodes 101 and the cylindrical electrode 102. In the apparatus example illustrated in FIG. 9, the apparatus has three internal electrodes 101, they are connected to the ac power supply (ac voltage supply) 109, and the cylindrical electrode 102 surrounding them is electrically grounded. The number of internal electrodes can be determined arbitrarily depending upon the scale of the apparatus, and the scale of the apparatus can be increased without lowering the processing efficiency, by increasing the number of electrodes in the case of large processing flow rates. However, no discharge will occur if the distance is large between the cylindrical electrode and the internal electrodes. Further, if the distance is not uniform between the cylindrical electrode and the internal electrodes, there will appear variation in the discharge, so as to result in dispersion of decomposition percentages. Therefore, it is desirable to keep the cylindrical electrode at the constant distance from the internal electrodes, but there are no specific restrictions on the shape. The cross-sectional shape of the cylindrical electrode may be a complete round, an ellipse, a triangle, a rectangle, or either of other polygons. The connection of the electrodes can normally be reverse between the high potential side and the ground side in terms of capability of a discharge, but it is desirable to keep the internal electrodes at a higher potential in terms of safety, handling, and so on. The shape of the internal electrodes 101 is preferably the rodlike shape or the platelike shape. There are no specific restrictions on the cross-sectional shape thereof. The ac power supply 109 may also be replaced by a pulse power supply.

The inorganic dielectric 103 is filled between the electrodes. There are no specific restrictions on the shape of this inorganic dielectric 103, but a suitable shape is one permitting permeation of a gas through gaps of the inorganic dielectric like the granular material, as illustrated as an example in the drawings. The inorganic dielectric 103 is a ferroelectric material and, particularly, the dielectric constant thereof is desirably not less than about 1000. Therefore, preferred materials are barium titanate and strontium titanate. However, the materials for the inorganic dielectric are not limited to these examples. The inorganic dielectric may also be either one of commonly known dielectrics and can be selected according to the purpose.

Each of the electrodes is fixed while being held by the partitions 104 made of an insulating material and in the structure permitting permeation of a gas, e.g., of a mesh or punching board of an insulating material, such as Teflon, poly(ethylene terephthalate), or the like, as illustrated in FIG. 9. For connection with the power supply, portions of the electrodes may penetrate the partition 104. The plurality of penetrating portions (power-supply connection portions) 105 are coupled into one and then connected to the power supply 109. These do not always have to be coupled into one, but each of the internal electrodes may be independently connected to an individual power supply. The best method can be selected according to the circumstances including the apparatus cost, the space, and so on.

For generating the plasma by the present apparatus, the gas is first introduced under arbitrary pressure and at an arbitrary flow rate through the gas inlet 106. There are no specific restrictions on the gas. After the gas is introduced through the gas inlet 106, the gas diffuses into the diffusion space 107. The diffusion space 107 and the plasma space filled with the inorganic dielectric 103 are separated from each other by the partition 104 of the insulating material, whereby the inorganic dielectric 103 is prevented from entering the diffusion space 107.

The gas entering the diffusion space 107 then permeates through the holes of the insulator partition 104 to go into the plasma space filled with the inorganic dielectric 103. Here the ac voltage is applied to the high-potential electrodes (the internal electrodes 101 herein) to induce the glow discharge and generate the plasma (as the gas is changed into the plasma). On this occasion, when the gas contains an organic compound, the organic compound is decomposed by the energy of the plasma. There are no specific restrictions on the organic compound in this case and the apparatus is particularly effective to the decomposition of the chemical substances that cannot be released in high concentrations into the atmosphere, e.g., such as the volatile organic compounds, the chlorine-based substances, and so on. The plasma gas in the apparatus flows through the gas outlet 108 out of the apparatus. In the case wherein the organic compound is decomposed, the products resulting from the decomposition, together with the other gas, go out of the apparatus.

In the case of execution of decomposition by this method, the discharge states differ depending upon voltages applied to the electrodes, the gas flow rates, the areas of the electrodes, the electrode-to-electrode distances, the dielectric characteristics, etc., and thus decomposition characteristics of the organic compound also differ. Therefore, the products can be controlled by selecting a decomposition level according to the purpose. The products resulting from the decomposition may also be subjected to an optimum secondary processing, such as collection with water scrubber or activated carbon, or the like, as occasion may demand.

Examples of the present invention will be described hereinafter, but it is noted that the present invention is by no means intended to be limited to these examples. Examples 1 to 4 associated with the first embodiment of the present invention will be described hereinafter.

EXAMPLE 1

Figure 5:
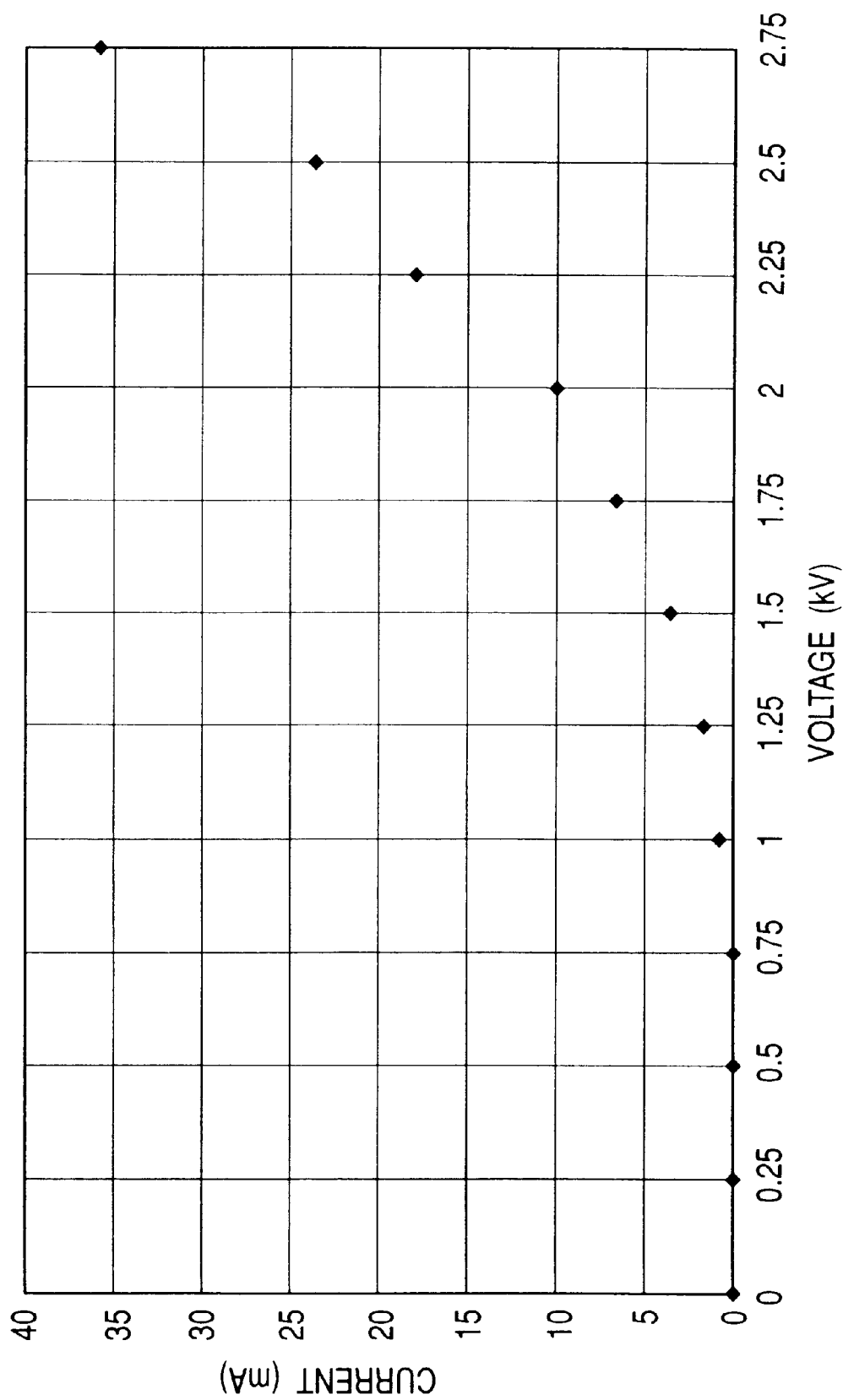
FIG. 5 is a diagram showing change of electric current against applied voltage in Example 1 of the invention.

The plasma was generated using the apparatus illustrated in FIG. 1. The electrodes were five electrodes (electrodes 1 to 5), the electrode shape was the platelike shape, the dimensions thereof were 60 mm×180 mm and 1 mm thick, and they were made of stainless steel. The distance between adjacent electrodes was 12 mm. The space between the electrodes was filled with pellets of barium titanate ($BaTiO_3$) having the average particle size of 3 mm and the dielectric constant of 7000 as the inorganic dielectric 7. Namely, the space was filled by the totally four layers of the inorganic dielectric. Pure nitrogen in the purity of not less than 99.9995% available from Toyoko Kagaku Co. was introduced at the flow rate of 1 liter per minute through the gas inlet 11 and the ac voltage was applied. The voltage was the ac voltage applied from the high voltage power supply 6 available from Kikusui Denshi Co., to the electrodes 1, 3, 5. FIG. 5 shows current values measured with change of the voltage. It is apparent from FIG. 5 that the discharge is generated in the reactor.

EXAMPLE 2

Figure 6:
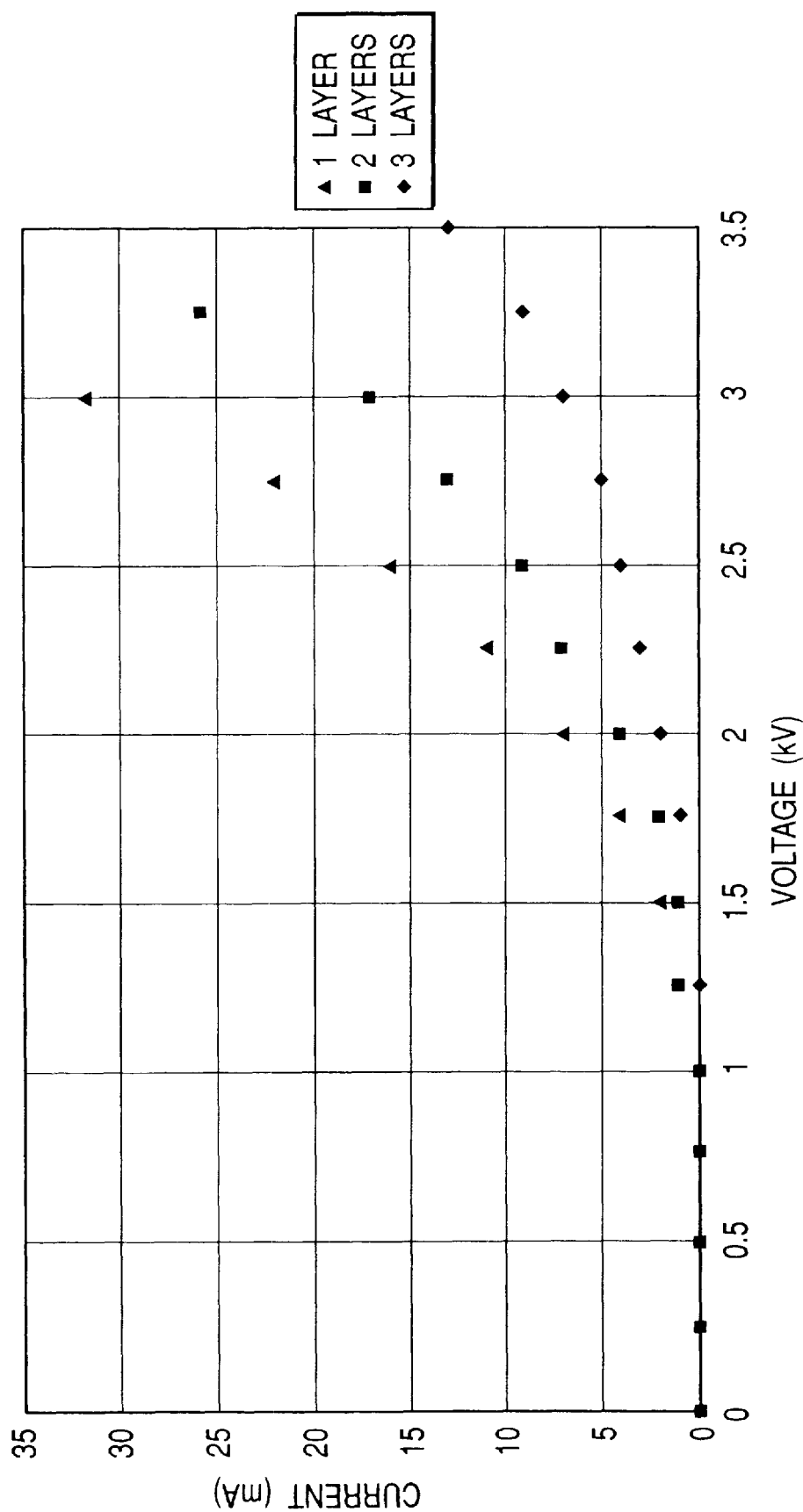
FIG. 6 is a diagram showing change of generated current against the number of inorganic dielectric layers in Example 2 of the invention.

Next, current values with application of voltage are presented in FIG. 6, in the following three cases ((A) to (C)); (A) a case wherein the inorganic dielectric fills only one layer between the electrode 1 and the electrode 2; (B) a case wherein the inorganic dielectric fills two layers between the electrode 1 and the electrode 2 and between the electrode 2 and the electrode 3; (C) a case wherein the inorganic dielectric fills three layers between the electrode 1 and the electrode 2, between the electrode 2 and the electrode 3, and between the electrode 3 and the electrode 4. The other conditions are the same as in Example 1. As seen from FIG. 6, currents increase at the same applied voltage with increase in the number of layers of the inorganic dielectric.

EXAMPLE 3

Figure 7:
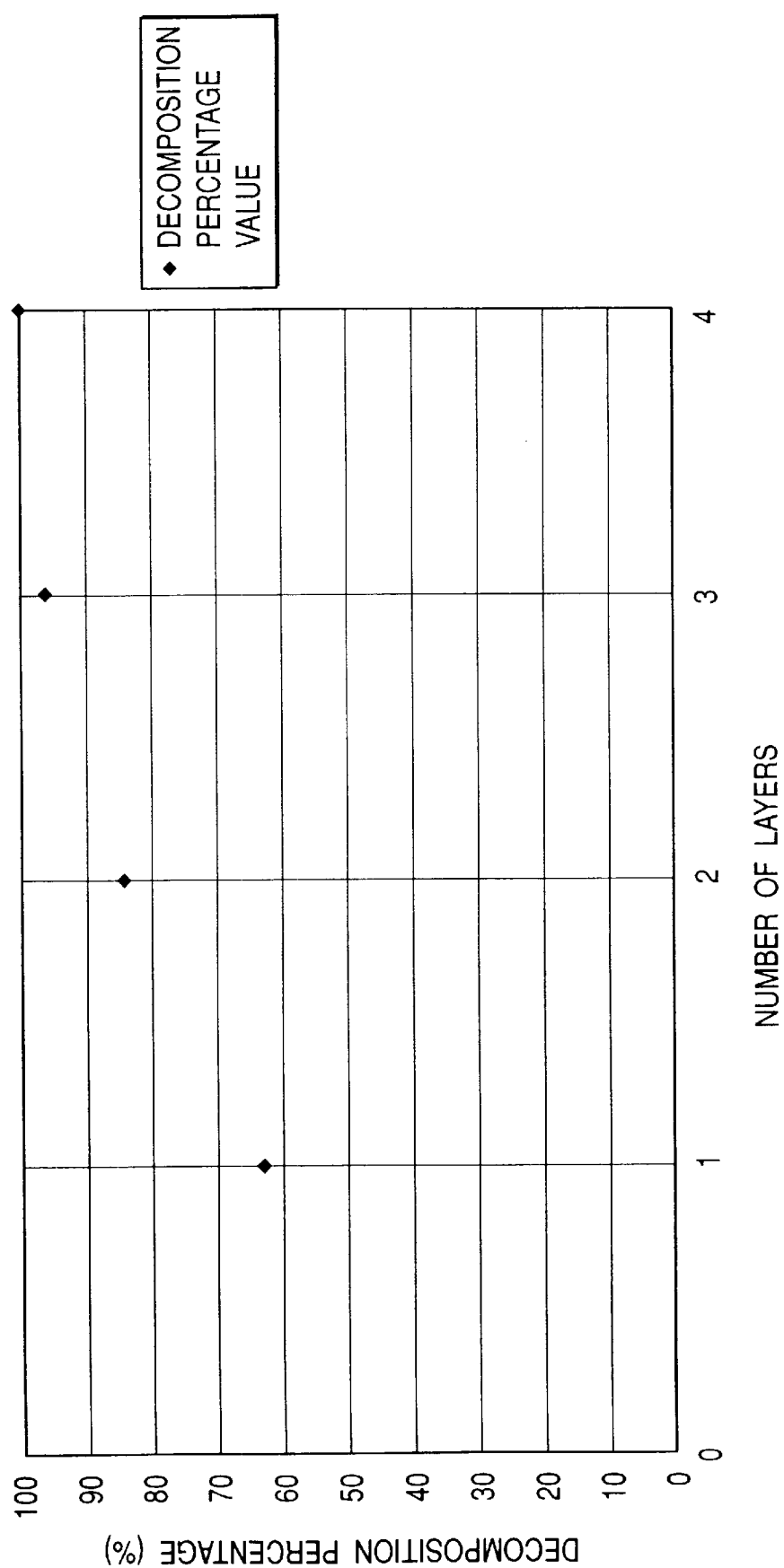
FIG. 7 is a diagram showing change of decomposition percentage of an organic compound against the number of inorganic dielectric layers in Example 3 of the invention.

Next, the discharge was generated with change in the number of inorganic dielectric layers in the same manner as in Example 2, except that a gas containing methanol in the concentration of 300 ppm in air was introduced instead of pure nitrogen. The discharge was generated with application of the ac voltage of 2.5 kV. The gas from the outlet of the apparatus (the gas outlet) was analyzed by a gas chromatograph-mass spectrometer 6890/5973 available from HP Inc. to evaluate the products, and the decomposition percentages of methanol were calculated based thereon. FIG. 7 shows the results showing the decomposition percentages of methanol against the number of inorganic dielectric layers. The decomposition percentages increased with increase in the number of inorganic dielectric layers.

The decomposition percentages were calculated according to the following equation.

Decomposition percentage (%)=(amount of the organic compound in the gas after the plasma processing (decomposition processing))/(amount of the organic compound in the gas before the plasma processing)×100

EXAMPLE 4

Figure 8:
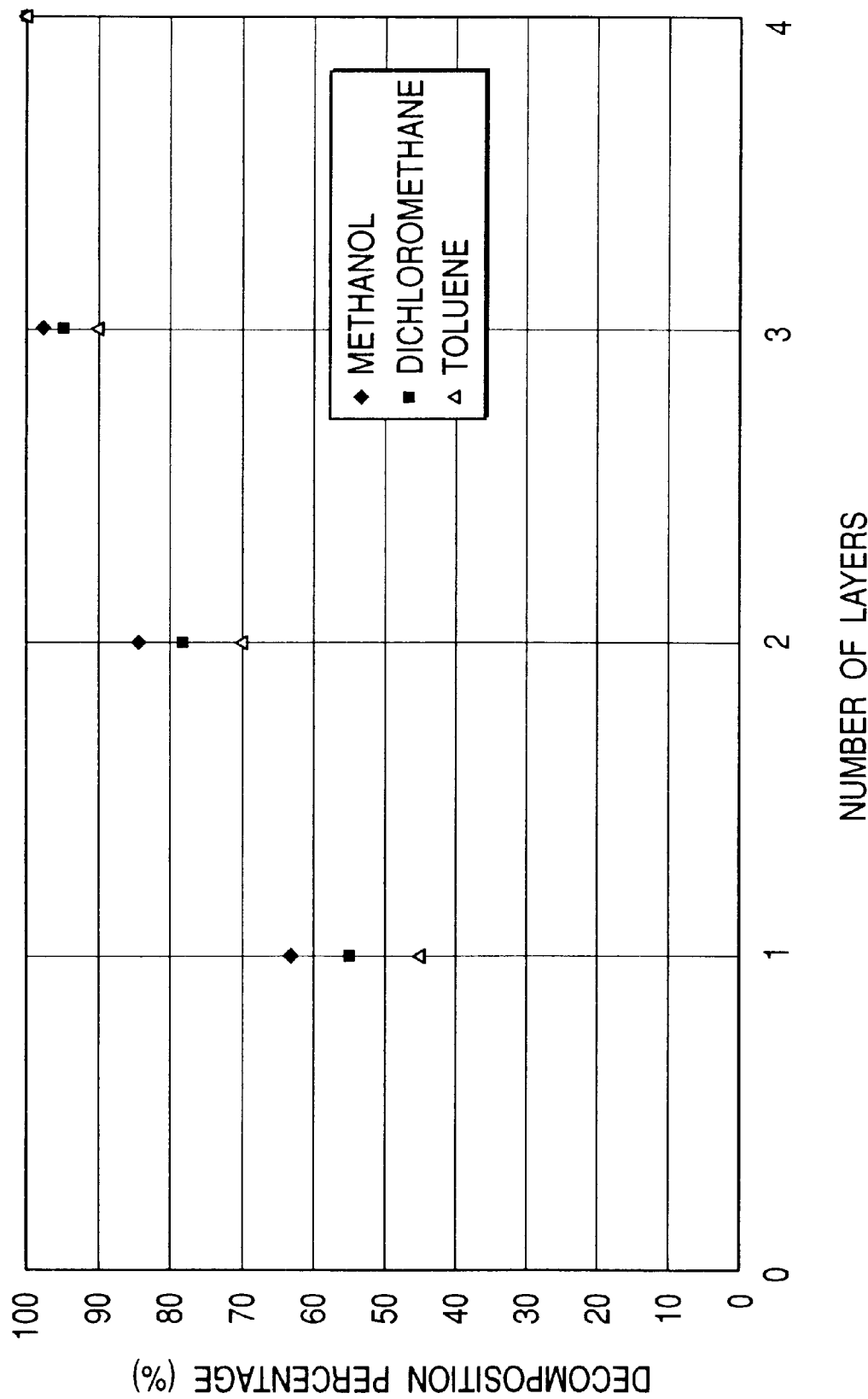
FIG. 8 is a diagram showing change of decomposition percentage of an organic compound against the number of inorganic dielectric layers in Example 4 of the invention.

The decomposition processing was carried out in the same method and under the same conditions as in Example 3, except that the processing gas was changed to a gas containing three types of solvents, methanol 100 ppm, dichloromethane 100 ppm, and toluene 100 ppm. The results are presented in FIG. 8. The decomposition percentages increased with increase in the number of inorganic dielectric layers. The decomposition percentages were calculated for each of the three types of organic compounds.

Examples 5 to 9 associated with the second embodiment of the present invention will be described hereinafter.

EXAMPLE 5

Figure 13:
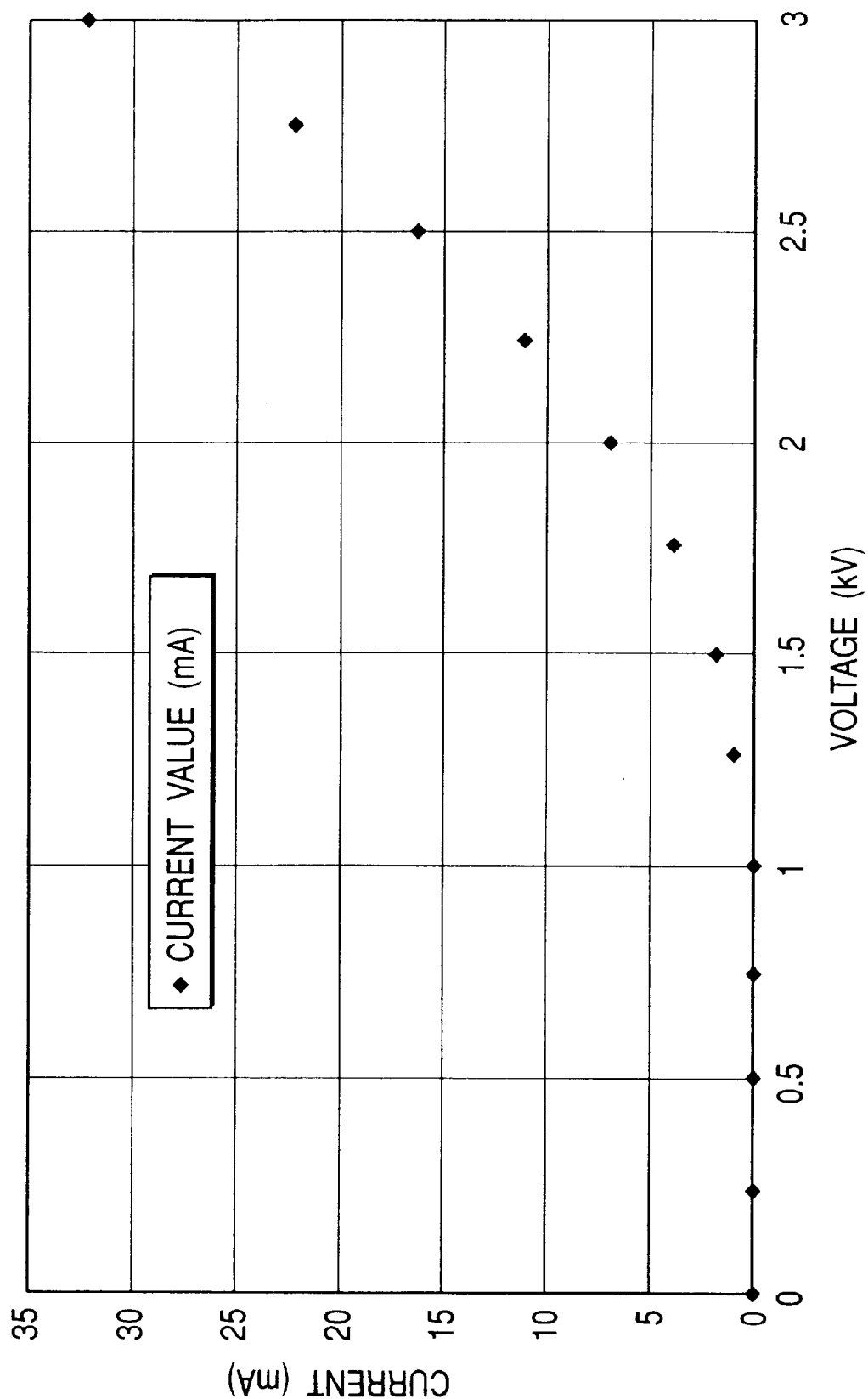
FIG. 13 is a diagram showing the relation between applied voltage and generated current in Example 5 of the invention.

In Example 5, the plasma was generated using the apparatus of the same shape as the discharge generating apparatus illustrated in FIG. 9 to FIG. 12. The size of the apparatus was as follows. The cylindrical electrode 102 was made of stainless steel and in the thickness of 1 mm. The cross-sectional shape of the cylindrical electrode illustrated in FIG. 10 was such that the end portions were semicircular in the radius of 10 mm and the linear portion 110 was 22 mm long. The length of the cylindrical electrode 102 was 100 mm in the direction of the generatrix thereof. The internal electrodes 101 were rodlike electrodes and were made of stainless steel in the diameter of 2 mm and in the length of 80 mm. The distance between the cylindrical electrode 102 and the internal electrodes 101 and the distance between the internal electrodes were uniform and each 9 mm. The space between the electrodes was filled with pellets of barium titanate ($BaTiO_3$) having the average particle size of 3 mm as the inorganic dielectric 103. Pure nitrogen in the purity of not less than 99.9995% available from Toyoko Kagaku Co. was introduced at the flow rate of 1 liter per minute through the gas inlet 106 and the ac voltage of 50 Hz was applied. The voltage was the ac voltage applied from the high voltage power supply 109 available from Kikusui Denshi Co., to the internal electrodes 101. Current values appearing with change in voltage are presented in FIG. 13. It is apparent from FIG. 13 that the discharge occurs in the reactor.

COMPARATIVE EXAMPLE 1

Figure 14:
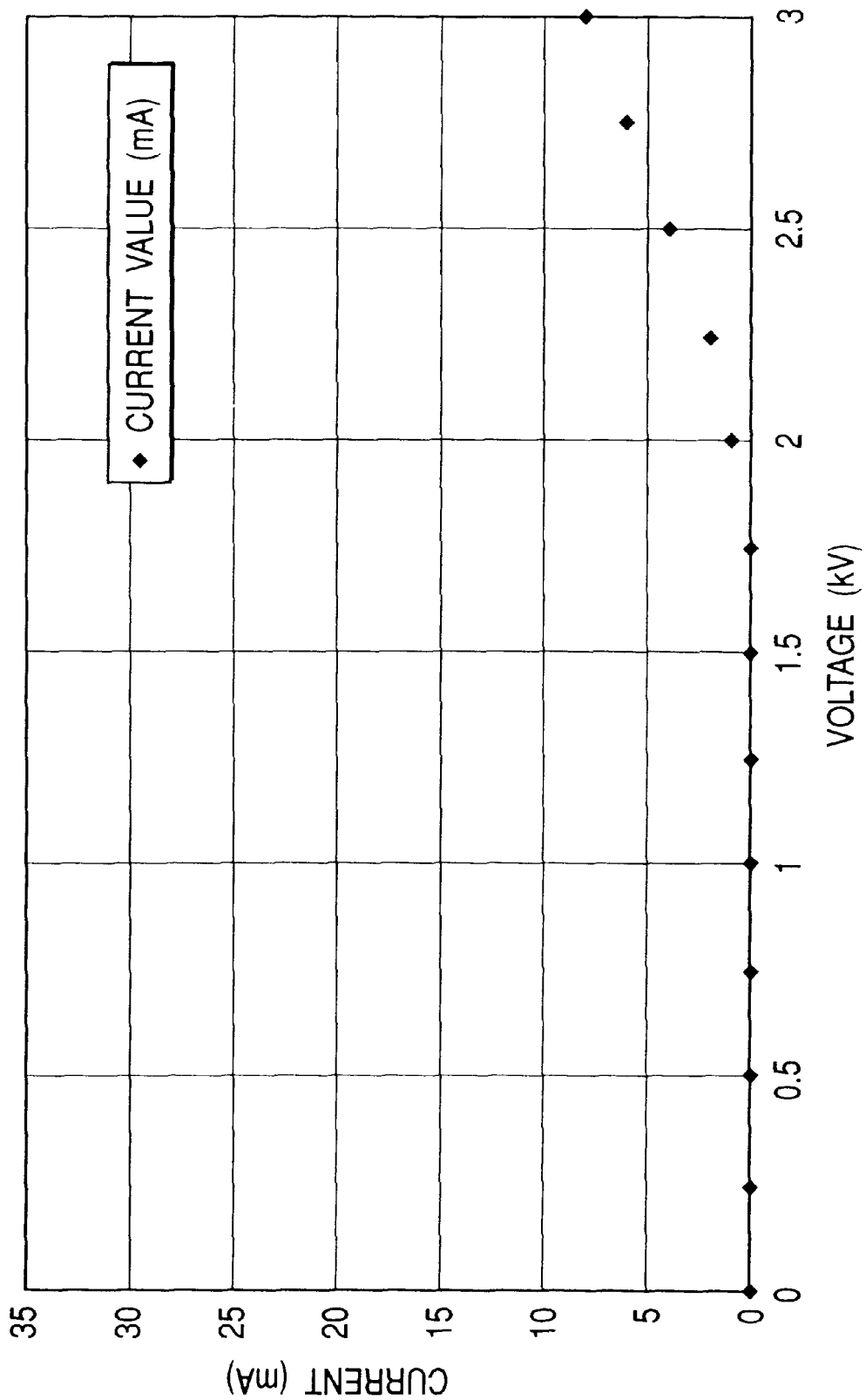
FIG. 14 is a diagram showing the relation between applied voltage and generated current in Comparative Example 1.

In Comparative Example 1, the ac voltage was applied in the same manner and with the same apparatus as in Example 5, except that only one internal electrode was used. The internal electrode was placed in the central part of the cylindrical electrode 102. Current values appearing with change in voltage are presented in FIG. 14. It is seen from FIG. 14 that the current values at the same applied voltage are lower in the comparative example with one internal electrode than in Example 5.

EXAMPLE 6

In Example 6, the plasma was generated under flow of the gas containing methanol 300 ppm in air, using the same apparatus as in Example 5, thereby decomposing methanol. The decomposition conditions were as follows.

Flow rate: 1 liter per minute

Input voltage: ac voltage of 50 Hz and 3 kV

The gas from the gas outlet 108 was analyzed by GC/MS and it was confirmed that methanol was completely decomposed and the products identified were carbon dioxide, carbon monoxide, nitrogen dioxide, nitrogen monoxide, and dinitrogen oxide.

EXAMPLE 7

In Example 7, the cylindrical electrode 102 was made of stainless steel in the cross-sectional shape having the end portions of the radius of 10 mm and the straight portion 110 of 110 mm, the length thereof was 100 mm along the direction of the generatrix of the cylindrical electrode 102, and the thickness was 1 mm. The internal electrodes were eleven stainless steel rods having the radius of 2 mm, and the eleven internal electrodes were arranged at even intervals in the cylindrical electrode. Using this apparatus, methanol was decomposed by the same method as in Example 6. The decomposition conditions were as follows.

Flow rate: 3 liter per minute

Input voltage: 50 kHz and 3 kV

The gas after the plasma processing was analyzed by GC/MS and from the analysis, it was confirmed that methanol was completely decomposed, as in Example 6, and that the products identified were carbon dioxide, carbon monoxide, nitrogen dioxide, nitrogen monoxide, and dinitrogen oxide.

EXAMPLE 8

Example 8 was the same as Example 6 except that the gas flow rate (processing rate) was 3 liter per minute. It was verified that methanol remained 123 ppm in the gas after the plasma processing and thus the decomposition was incomplete.

EXAMPLE 9

In Example 9 the decomposition test was carried out in the same manner as in Example 7, except that the number of internal electrodes was three. As a result, methanol remained 251 ppm in the gas after the plasma processing. From comparison of the present example with Example 7, it was seen that the larger the number of internal electrodes, the higher the decomposition capability was.

It became apparent from above Examples 5 to 9 and Comparative Example 1 that the plasma was induced better and more methanol of the organic compound was decomposed as the number of internal electrodes increased. These results imply without doubt that the organic compounds other than methanol can also be decomposed.

As detailed above, according to the present invention, the high-potential and low-potential electrodes are formed so that at least either one of the high-potential electrode and the low-potential electrode is comprised of a plurality of electrodes, the space between the electrodes is filled with the inorganic dielectric having the structure permitting flow of the gas, and the glow discharge is generated between the electrodes to change the gas existing between the electrodes, into the plasma under ordinary pressure, whereby a large amount of an atmospheric plasma can be generated, so as to be able to greatly increase the processing efficiency of the plasma processing or the gas decomposition. It also facilitates increase in the size of apparatus.

What is claimed is:

1. A discharge generating apparatus comprising high-potential and low-potential electrodes, at least either one of the high-potential electrode and the low-potential electrode comprising a plurality of electrodes, the discharge generating apparatus having a configuration such that a space between the electrodes is filled with an inorganic dielectric having a structure permitting flow of a gas, wherein a discharge is generated between the electrodes to change the gas existing between the electrodes, into a plasma.

2. The discharge generating apparatus according to claim 1, wherein the gas existing between the electrodes is changed into the plasma under ordinary pressure.

3. The discharge generating apparatus according to claim 1, wherein the discharge is a glow discharge.

4. The discharge generating apparatus according to claim 1, wherein the high-potential and low-potential electrodes are arranged in alternate fashion and the inorganic dielectric is filled between one high-potential electrode and at least one low-potential electrode.

5. The discharge generating apparatus according to claim 4, wherein the high-potential electrode is connected to an ac voltage supply or to a pulse voltage supply and the low-potential electrode is grounded.

6. The discharge generating apparatus according to claim 4, wherein the high-potential electrode is connected through an electric conductor to an ac voltage supply or to a pulse voltage supply and the low-potential electrode is grounded through another electric conductor.

7. The discharge generating apparatus according to claim 1, wherein at least an organic compound existing in the gas is decomposed by the discharge.

8. The discharge generating apparatus according to claim 1, wherein the inorganic dielectric has a structure with gaps permitting flow of the gas and generating the discharge in the gaps of the inorganic dielectric.

9. The discharge generating apparatus according to claim 1, wherein the inorganic dielectric is a ferroelectric material.

10. The discharge generating apparatus according to claim 1, wherein the inorganic dielectric is comprised of at least one selected from barium titanate and strontium titanate.

11. The discharge generating apparatus according to claim 1, wherein the inorganic dielectric is a granular material.

12. A discharge generating apparatus comprising high-potential and low-potential electrodes, at least either one of the high-potential electrode and the low-potential electrode comprising a plurality of electrodes, the discharge generating apparatus having a configuration such that a space between the electrodes is filled with an inorganic dielectric having a structure permitting flow of a gas, wherein a discharge is generated between the electrodes to change the gas existing between the electrodes, into a plasma, wherein one of the high-potential electrode and low-potential electrode is two or more internal electrodes and the other includes a cylindrical electrode surrounding the internal electrodes.

13. The discharge generating apparatus according to claim 12, wherein the shape of the internal electrodes is a rodlike shape or a platelike shape.

14. The discharge generating apparatus according to claim 12, wherein the internal electrodes are connected to an ac voltage supply or to a pulse voltage supply and the cylindrical electrode is grounded.

15. The discharge generating apparatus according to claim 12, wherein the inorganic dielectric is filled in the presence of a gap permitting the gas to flow between the internal electrodes and the cylindrical electrode.

16. A discharge generating method comprising the steps of placing high-potential and low-potential electrodes, at least either one of the high-potential electrode and the low-potential electrode comprising a plurality of electrodes, and filling a space between the electrodes with an inorganic dielectric having a structure permitting flow of a gas, wherein a discharge is generated between the electrodes to change the gas existing between the electrodes, into a plasma.

17. The discharge generating method according to claim 16, wherein the gas existing between the electrodes is changed into the plasma under ordinary pressure.

18. The discharge generating method according to claim 16, wherein the discharge is a glow discharge.

19. The discharge generating method according to claim 16, wherein the high-potential and low-potential electrodes are arranged in alternate fashion and the inorganic dielectric is filled between one high-potential electrode and at least one low-potential electrode.

20. The discharge generating method according to claim 19, wherein the high-potential electrode is connected to an ac voltage supply or to a pulse voltage supply and the low-potential electrode is grounded.

21. The discharge generating method according to claim 19, wherein the high-potential electrode is connected through an electric conductor to an ac voltage supply or to a pulse voltage supply and the low-potential electrode is grounded through another electric conductor.

22. The discharge generating method according to claim 16, wherein at least an organic compound existing in the gas is decomposed by the discharge.

23. The discharge generating method according to claim 16, wherein the inorganic dielectric has a structure with gaps permitting flow of the gas and generating the discharge in the gaps of the inorganic dielectric.

24. The discharge generating method according to claim 16, wherein the inorganic dielectric is a ferroelectric material.

25. The discharge generating method according to claim 16, wherein the inorganic dielectric is comprised of at least one selected from barium titanate and strontium titanate.

26. The discharge generating method according to claim 16, wherein the inorganic dielectric is a granular material.

27. A discharge generating method comprising the steps of placing high-potential and low-potential electrodes, at least either one of the high-potential electrode and the low-potential electrode comprising a plurality of electrodes, and filling a space between the electrodes with an inorganic dielectric having a structure permitting flow of a gas, wherein a discharge is generated between the electrodes to change the gas existing between the electrodes, into a plasma, wherein one of the high-potential electrode and low-potential electrode includes two or more internal electrodes and the other includes a cylindrical electrode surrounding the internal electrodes.

28. The discharge generating method acccording to claim 27, wherein the shape of the internationl electrodes is a rodlike shape or a platelike shape.

29. The discharge generating method according to claim 27, wherein the internal electrodes are connected to an ac voltage supply or to a pulse voltage supply and the cylindrical electrode is grounded.

30. The discharge generating method according to claim 27, wherein the inorganic dielectric is filled in the presence of a gap permitting the gas to flow between the internal electrodes and the cylindrical electrode.

* * * * *

UNITED STATES PATENT AND TRADEMARK OFFICE
CERTIFICATE OF CORRECTION

PATENT NO. : 6,621,227 B1
DATED : September 16, 2003
INVENTOR(S) : Toshiji Nishiguchi et al.

It is certified that error appears in the above-identified patent and that said Letters Patent is hereby corrected as shown below:

Title page,
Item [56], References Cited, FOREIGN PATENT DOCUMENTS,
"8321397" should read -- 8-321397 --;
"1000325" should read -- 10-00325 --; and insert
-- JP 2-131120 5/1990 --.

Column 4,
Line 34, "example." should read -- example --.

Column 12,
Line 54, "internationl" should read -- internal --.

Signed and Sealed this

Third Day of February, 2004

JON W. DUDAS
*Acting Director of the United States Patent and Trademark Office*